United States Patent [19]

Lai

[11] Patent Number: 5,426,385
[45] Date of Patent: Jun. 20, 1995

[54] DOUBLE POSITIVE FEEDBACK LOOP PRECHARGE CMOS SINGLE-ENDED SENSE AMPLIFIER

[75] Inventor: Fei-Pi Lai, Taipei, Taiwan, Prov. of China

[73] Assignee: National Science Council, Taipei, Taiwan, Prov. of China

[21] Appl. No.: 255,016

[22] Filed: Jun. 7, 1994

[51] Int. Cl.⁶ ................................... G01R 19/155
[52] U.S. Cl. ....................... 327/57; 327/51; 327/374; 365/189.05
[58] Field of Search ............... 307/452, 530; 365/203, 365/189.05; 327/54, 51, 374, 376, 377, 57

[56] References Cited

U.S. PATENT DOCUMENTS

| | | | |
|---|---|---|---|
| 4,823,031 | 4/1989 | Kadakia | 307/530 |
| 4,982,363 | 1/1991 | Sood | 307/530 |

*Primary Examiner*—Timothy P. Callahan
*Assistant Examiner*—Jung Ho Kim
*Attorney, Agent, or Firm*—Townsend and Townsend Khourie and Crew

[57] ABSTRACT

A single ended sense amplifier that not only preserves the high speed feature of the ordinary $|V_{TP}|$, the threshold voltage of a PMOS transistor, but also eliminates the current leakage problem of conventional designs. The single-ended sense amplifier uses seven transistors and one phase clock instead of eleven transistors and two phase clocks as used in the prior art.

4 Claims, 3 Drawing Sheets

DOUBLE POSITIVE FEEDBACK LOOP PRECHARGE CMOS SINGLE-ENDED SENSE AMPLIFIER

BACKGROUND

The present invention relates generally to a double positive-feedback-loop precharge CMOS single-ended sense amplifier, and more particularly to a double positive-feedback-loop precharge CMOS single-ended sense amplifier that eliminates the leakage current problem and reduces the space required due to the clock signal and by the complexity of the design respectively.

Most dynamic RAMs and Static RAMs use differential sense amplifiers having good common mode noise rejection ratios. A single-ended differential sense amplifier is employed to fit the single-ended bit-line structure. Especially in multiprocessing and super scalar CPU structure, multiport memories are used for space considerations. The importance of the single-ended sense amplifier will increase as its applications grow.

FIG. 1 is a circuit diagram of a conventionally designed static sense amplifier including two NMOS transistors 10 & 12, a capacitor 14, and two inverters 16 & 18. The inverter 16 consist of a PMOS 162 and a NMOS 164. Inverter 18 consists of a PMOS 182 and an NMOS 184. When input signal $V_{in}$ is a logic LOW, NMOS 10 is cut off and NMOS 12 pulls up the voltage potential of node A until it reaches a particular level. At this point, both PMOS 162 and NMOS 164 in inverter 16 are on. Meanwhile the voltage potential at node B is between $V_{dd}$ and $V_{ss}$. Because of the negative feedback circuit path, NMOS 12 can not fully charge node A to the level of $V_{dd}$. Later, when input signal $V_{in}$ is a logic HIGH, NMOS 10 is on and discharges node A until the voltage of node A drops slightly below the threshold voltage of inverter 16. At the same time, NMOS 12 is turned on by NMOS 10. In this case, NMOS 10 and NMOS 12 form a voltage divider that clamps the potential of node A between 0 volt (Vss) and the threshold voltage of inverter 16. As a result, the potential of node A is not charged and discharged between Vss and Vdd; instead it is confined around the threshold voltage of inverter 16.

However, when input signal $V_{in}$ is a logic LOW (i.e., NMOS 10 is cutoff), PMOS 162 and NMOS 164 of inverter 16 are both on; and as a result, a direct current path is formed. Likewise, when input signal $V_{in}$ is a logic HIGH (i.e., NMOS 10 is on), NMOS 10 and NMOS 12 are both on and form a direct current path. The direct current path wastes electric energy. Therefore, the above method of prior art is energy consuming.

FIG. 2 is a circuit diagram of a conventional threshold voltage sense amplifier which includes: a NOR gate 20; three PMOS transistors 21,24,25; two NMOS transistors 22,26; a capacitor 23; and an inverter 27. The symbols "$\phi_1$" and "$\phi_2$" are phase 1 and phase 2 of a nonoverlapped two-phase clock signal. Phase 1 is the pre-charge phase and phase 2 is the evaluation phase. In phase 1, node D is pre-charged to $V_{dd}$, and node E is pre-discharged to $V_{ss}$. In phase 2, if the input signal $V_{in}$ is low, then node C is pulled high, and both node D and node E drop to low. If $V_{in}$ is high, then node D remains high, and $V_{out}$ is also high. But if $V_{in}$ is high, node D may not contain enough charges to stay high. In other words, the current leakage of NMOS 22 may be so large that node D drops to a value smaller than $V_{dd}$ in the evaluation phase. The error occurs when the value of node D is less than $V_{dd} - |V_{TP}|$.

Another drawback of a conventional threshold voltage sense amplifier is its use of memory space. The NOR gate and the NMOS transistors have to be duplicated many times in a memory layout, since every memory cell is connected to a sense amplifier through these elements.

SUMMARY

The present invention provides a new single-ended sense amplifier capable of preserving the high-speed feature of the ordinary threshold voltage of a PMOS transistor, eliminating the leakage current problem and reducing both the space required by the clock signal and the complexity of the design.

The invention provides a modified $|V_{TP}|$ sense amplifier between a first voltage reference and a second voltage reference, controlled by a clock phase signal to trigger pre-charge/discharge to input a signal through an input terminal, and to output a signal through an output terminal. The modified $|V_{TP}|$ sense amplifier includes a first MOS transistor having a source terminal to which a first voltage potential is applied, a gate terminal connected to the phase clock signal, and a drain connected to the input terminal; a second MOS transistor having a source terminal to which a second voltage potential is applied, and a drain terminal connected to the input terminal; a third MOS transistor having a source terminal to which the first voltage potential is applied, a gate terminal connected to the input terminal, and a drain terminal connected to the gate of the second MOS transistor; a fourth MOS transistor having a source terminal on which the second voltage potential is applied, a gate connected to the inverted phase clock signal, and a drain connected to the gate of the second MOS transistor; a fifth MOS transistor having a source on which is applied the second voltage potential, a gate connected to the output terminal, and a drain connected to the gate of the second MOS transistor; and an inverter having an input port connected to the gate of the second MOS transistor and an output port connected to the output terminal.

The novel design of this invention uses seven transistors instead of eleven and one phase clock instead of two phase clocks, and therefore has the advantages of using less space and minimizing complexity.

Moreover, the positive feedback loop formed by the second MOS and the third MOS reduces the charge time; the positive feedback loop formed by the fifth MOS and the inverter reduces the discharge time. As a result, the speed of the sense amplifier is enhanced eliminating the problem of leakage current.

BRIEF DESCRIPTION OF THE DRAWINGS

The present invention can be more fully understood by reference to the following detailed description and accompanying drawings, which form the integral part of this application, and wherein.

DESCRIPTION OF THE PREFERRED EMBODIMENT

Figure 1:
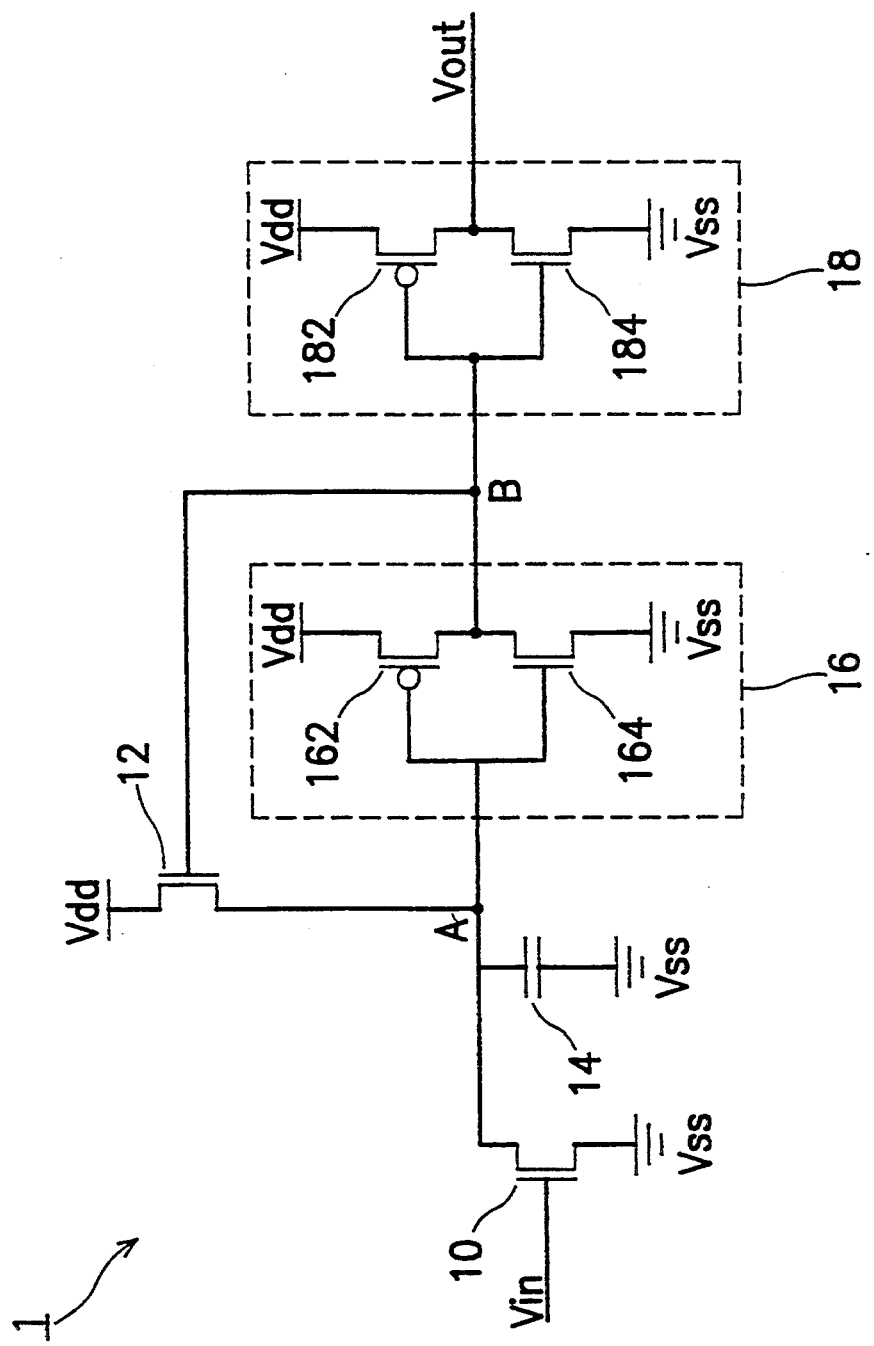
FIG. 1 is a circuit diagram of a static sense amplifier of the prior art.
Figure 2:
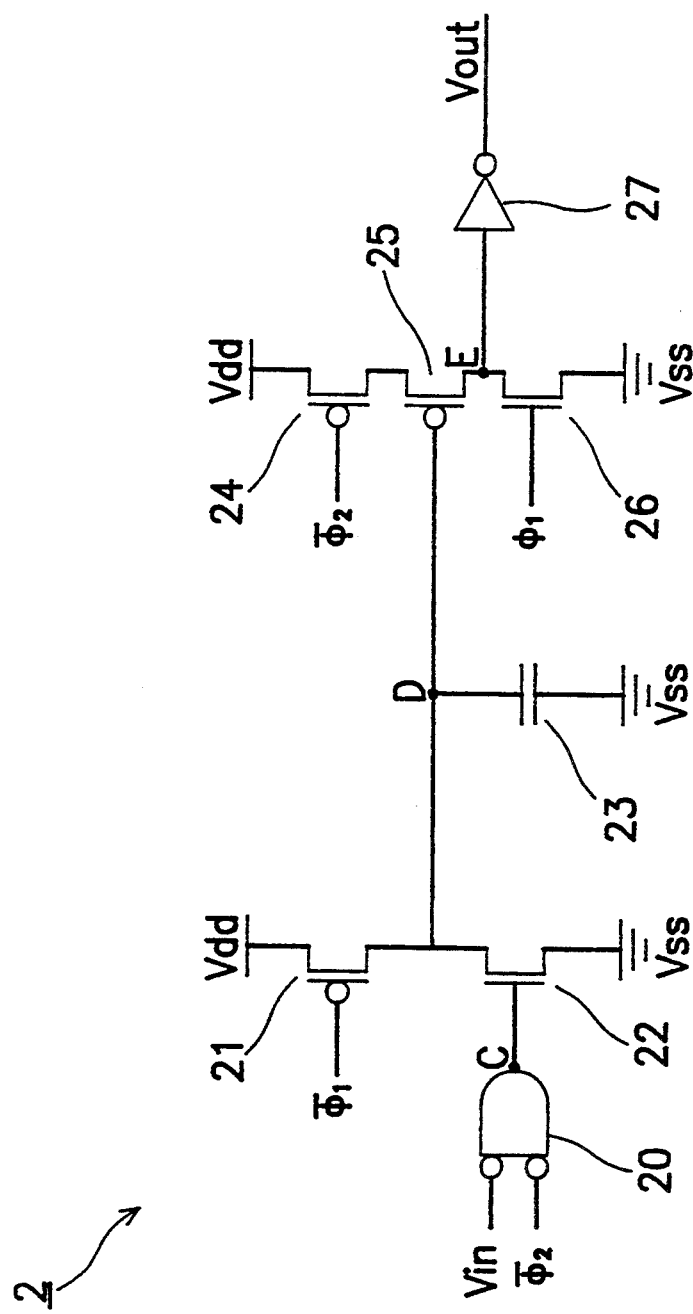
FIG. 2 is a circuit diagram of a threshold voltage sense amplifier of the prior art.
Figure 3:
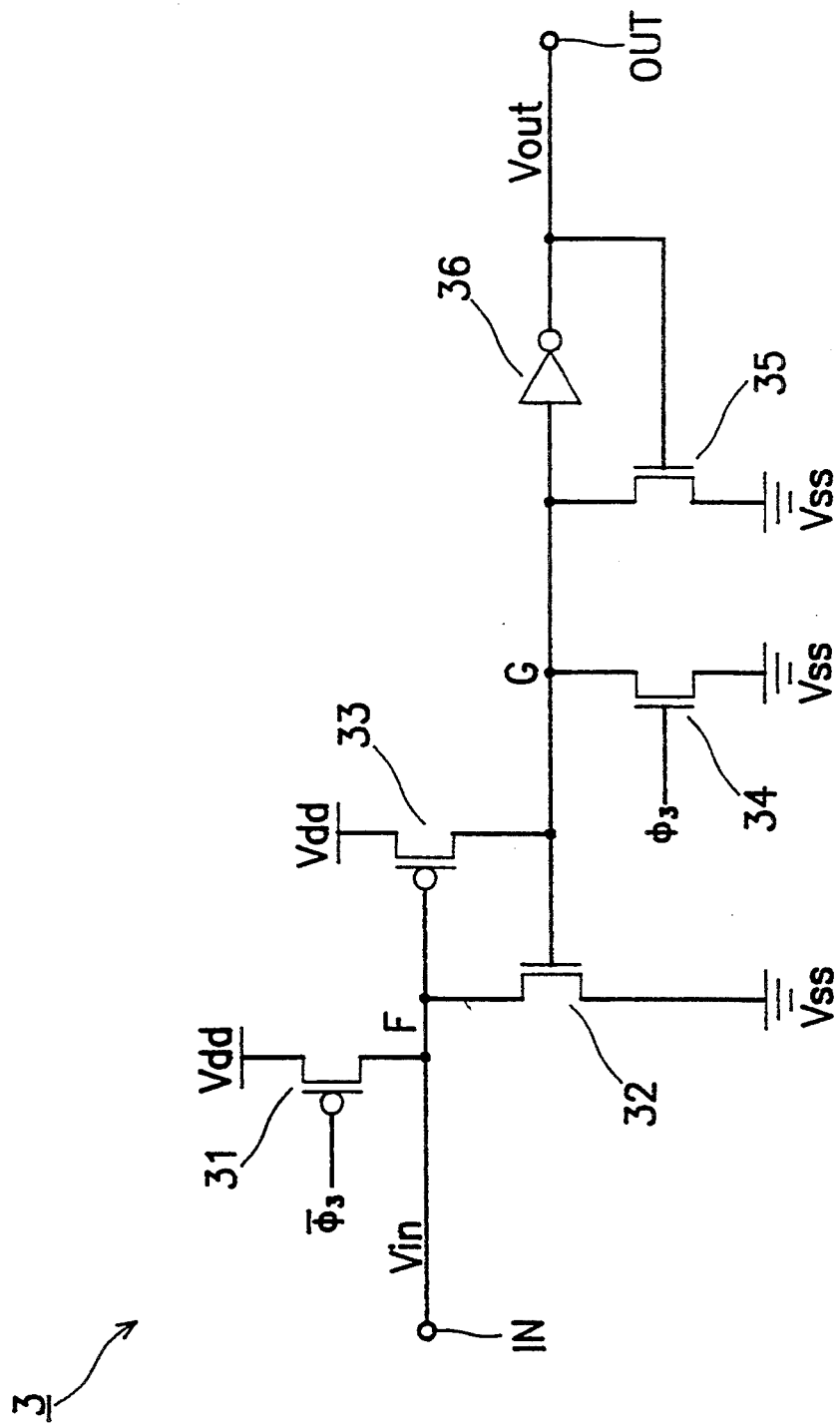
FIG. 3 is a circuit diagram of a double positive-feedback loop pre-charge/pre-discharge single-ended sense amplifier according to this invention.

In FIG. 3, which is the circuit diagram for double positive feedback loop pre-charge/pre-discharge single-ended sense amplifier of this invention, the amplifier 3 is used between the voltages Vdd and Vss and is triggered by a phase clock signal $\phi_3$ to pre-charge or pre-discharge amplifier 3. The double positive feedback pre-charge/pre-discharge single-ended sense amplifier of this invention includes five MOS transistors, 31, 32, 33, 34, 35, and an inverter 36.

MOS transistor 31 is, for example, a PMOS transistor having its source connected to $V_{dd}$, its gate connected to the phase clock $\phi_3$, and its drain connected to the input node, $V_{in}$.

MOS transistor 32 is, for example, an NMOS of which the source is connected to $V_{ss}$ and the drain is connected to the input node, $V_{in}$.

MOS transistor 33 is, for example, a PMOS of which the source is connected to $V_{dd}$, the gate is connected to the input node $V_{in}$, and the drain is connected to the gate of MOS 32.

MOS transistor 34 is, for example, an NMOS of which the source is connected to $V_{ss}$, the gate is connected to the phase clock phase signal $\phi_3$, and the drain is connected to the gate of MOS 32.

MOS transistor 35 is, for example, an NMOS of which the source is connected to $V_{ss}$, the gate is connected to the output port, and the drain is connected to the gate of MOS 32.

Inverter 36 includes a PMOS and an NMOS. Its input is connected to the gate of MOS 32 and its output connected to the output port $V_{out}$.

In addition, when clock phase signal $\phi_3$ is high, MOS 31 and MOS 34 are on; consequently, the node F is charged, and node G is discharged. When $V_{in}$ is high, MOS 33 is cut off, and node G is low; consequently, MOS 32 is off, and $V_{out}$ is high so that MOS 35 is on. When $V_{in}$ is low, MOS 33 is on, and node G is high; consequently, MOS 32 is on, and $V_{out}$ is low so that MOS 35 is cutoff. In this way, between the $V_{dd}$ and $V_{ss}$, there is no direct current path; therefore, the current leakage problem is eliminated.

Furthermore, MOS 32 and MOS 33 form a positive feedback loop which reduces the charging time of node G; and MOS 35 and inverter 36 form another positive feedback loop that reduces the discharging time of node G; as a result, the speed of the sense amplifier of this invention is greatly enhanced.

As described previously, the double positive feedback pre-charge/pre-discharge single ended sense amplifier of this invention employs only one clock phase signal to control charging and discharging and only seven MOS transistors; consequently, it uses less space and is thus less complex in fabrication. Moreover, as a result of the double positive-feedback-loops for charging and discharging, the speed is enhanced and the problem of leakage current is eliminated.

While the above is a complete description of the preferred embodiments of the invention, various alternatives, modifications, and equivalents may be used. Therefore, the above description should not be taken as limiting the scope of the invention which is defined by the appended claims.

What is claimed is:

1. A double positive-feedback-loop pre-charge/pre-discharge single-ended sense amplifier controlled by a clock phase signal to trigger pre-charge/discharge in order to input a signal through an input terminal and output said signal through an output terminal; said single-ended sense amplifier comprising:

a first MOS transistor having a source terminal to which a first voltage potential is applied, a gate terminal coupled to said clock phase signal, and a drain terminal coupled to said input terminal;

a second MOS transistor having a source terminal to which a second voltage potential is applied, and a drain terminal coupled to said input terminal;

a third MOS transistor having a source terminal to which said first voltage potential is applied, a gate terminal coupled to said input terminal, and a drain terminal coupled to a gate of said second MOS transistor;

a fourth MOS transistor having a source terminal to which said second voltage potential is applied, a gate terminal coupled to an inverted clock phase signal, and a drain terminal coupled to said gate of said second MOS transistor;

a fifth MOS transistor having a source terminal to which said second voltage potential is applied, a gate terminal coupled to said output terminal, and a drain terminal coupled to said gate of said second MOS transistor;

an inverter having an input port coupled to said gate of said second MOS transistor and an output port coupled to said output terminal.

2. The single-ended sense amplifier as claimed in claim 1, wherein said first voltage potential is higher than said second voltage potential and said first MOS transistor and said third transistor are PMOS transistors, said second MOS transistor, said fourth MOS transistor, and said fifth MOS transistor are NMOS transistors.

3. The single ended sense amplifier as claimed in claim 1, wherein said inverter consists essentially of a PMOS transistor and an NMOS transistor.

4. The single ended sense amplifier as claimed in claim 2, wherein said inverter is composed of a PMOS transistor and a NMOS transistor.

* * * * *